US 8,759,803 B2

(12) United States Patent
Smick et al.

(10) Patent No.: US 8,759,803 B2
(45) Date of Patent: Jun. 24, 2014

(54) ION IMPLANT APPARATUS AND A METHOD OF IMPLANTING IONS

(71) Applicant: GTAT Corporation, Nashua, NH (US)

(72) Inventors: Theodore Smick, Essex, MA (US); Geoffrey Ryding, Manchester, MA (US); Hilton Glavish, Incline Village, NV (US); Takao Sakase, Rowley, MA (US); William Park, Jr., Somerville, MA (US); Paul Eide, Stratham, NH (US); Drew Arnold, Salem, MA (US); Ronald Horner, Auburndale, MA (US); Joseph Gillespie, Boston, MA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 14/157,480

(22) Filed: Jan. 16, 2014

(65) Prior Publication Data

US 2014/0130741 A1    May 15, 2014

Related U.S. Application Data

(63) Continuation of application No. 13/296,436, filed on Nov. 15, 2011, now Pat. No. 8,633,458.

(51) Int. Cl.
*G21G 5/00* (2006.01)
(52) U.S. Cl.
USPC .............. 250/492.3; 250/492.1; 250/492.2
(58) Field of Classification Search
USPC ............................................ 250/492.1–492.3
See application file for complete search history.

(56) References Cited

U.S. PATENT DOCUMENTS

| 4,155,011 | A | 5/1979 | Mark |
| 5,084,624 | A | 1/1992 | Lamure et al. |
| 5,932,883 | A | 8/1999 | Hashimoto et al. |
| 5,981,961 | A | 11/1999 | Edwards et al. |
| 6,297,510 | B1 | 10/2001 | Farley |
| 7,291,535 | B2 * | 11/2007 | Niwayama et al. ........... 438/302 |
| 2002/0098713 | A1 | 7/2002 | Henley et al. |
| 2010/0133449 | A1 | 6/2010 | Takahashi |
| 2011/0073781 | A1 | 3/2011 | Leavitt et al. |

FOREIGN PATENT DOCUMENTS

WO    2011008413 A    1/2011

OTHER PUBLICATIONS

Camplan, J. et al., A High Current Ion Implanter with Hybrid Scanning, Nuclear Instruments and Methods, Jan. 1980, p. 245-250, North-Holland Publishing Company.
International Search Report and Written Opinion dated Mar. 4, 2013 for PCT Application No. PCT/US2012/064829.
Ruffell, John P. et al., A High Current, High Voltage Oxygen Ion Implanter, Nuclear Instruments and Methods in Physics Research, Jan. 1987, p. 229-234, B21, North-Holland, Amsterdam.

* cited by examiner

*Primary Examiner* — Michael Maskell
(74) *Attorney, Agent, or Firm* — The Mueller Law Office, P.C.

(57) ABSTRACT

Ion implant apparatus using a drum-type scan wheel holds wafers with a total cone angle less than 60°. A collimated scanned beam of ions, for example $H^+$, is directed along a final beam path which is at an angle of at least 45° to the axis of rotation of the scan wheel. Ions are extracted from a source and accelerated along a linear acceleration path to a high implant energy (more than 500 keV) before scanning or mass analysis. The mass analyzer may be located near the axis of rotation and unwanted ions are directed to an annular beam dump which may be mounted on the scan wheel.

20 Claims, 3 Drawing Sheets

ION IMPLANT APPARATUS AND A METHOD OF IMPLANTING IONS

CROSS-REFERENCE TO RELATED APPLICATION

This application is a continuation of U.S. patent application Ser. No. 13/296,436 filed on Nov. 15, 2011, entitled "Ion Implant Apparatus and a Method of Implanting Ions" and published as U.S. Patent Application Publication No. 2013-0119263, which is hereby incorporated by reference for all purposes.

BACKGROUND OF THE INVENTION

There is increasing demand for renewable energy using photovoltaic technology. In particular, photovoltaic cells are commonly formed on crystalline silicon wafers which are conventionally obtained by slicing a silicon ingot. This process, which typically yields a silicon wafer thicker than 115 µm, wastes a substantial amount of silicon by consuming up to 50% of the silicon body in kerf loss. The resulting wafers are also much thicker than is needed for useful photovoltaic devices.

Thinner silicon laminae have been made by exfoliation of film by heating after high dose ion implantation, typically with $H^+$ ions. However, to make useful silicon laminae by exfoliation for photovoltaic applications, it is necessary to implant ions at high energy, in order to create a weakness layer at sufficient depth.

Also, in order to provide relatively high productivity, it is desirable to employ high beam currents. Implant beams with an ionic current of 100 mA, and energies of 1 MeV, are now being contemplated. The effective beam power delivered to substrates being implanted can be in the order of 100 kW or higher. The need to prevent the substrates being heated by such high implant beam power to excessive temperatures presents a considerable challenge.

In a known type of ion implantation tool, a beam of ions to be implanted is directed at substrates (typically silicon wafers) mounted in a batch around the periphery of a process wheel. The process wheel or rotary scan assembly is mounted for rotation about an axis so that the wafers on the wheel pass one after the other through the ion beam. In this way, the power of the ion beam can be shared between the wafers in the batch on the process wheel. The wafers are mounted on substrate holders on the process wheel. The substrate holders comprise a heat sinking surface for supporting the wafer. Forced cooling of the heat sinking surfaces is typically provided by means of water cooling structures.

Contact between the wafers and the heat sinking support surfaces is maintained by canting the support surfaces inwards towards the axis of rotation, whereby the wafers are pressed by centrifugal force against the support surfaces as the process wheel rotates.

The effectiveness of the cooling of the wafers in such implant apparatuses using a rotary scan assembly can be dependent on the force with which wafers are pressed against the underlying heat sinking surfaces. There are known ion implant apparatuses which provide a rotary scan assembly in the form of a drum, with the wafers mounted around the interior face of the drum, substantially facing the axis of rotation. This arrangement maximizes the effect of centrifugal force on the wafers to optimize wafer cooling during the implant process.

Rotary drum type ion implant apparatuses can be physically extremely large. The diameter of the rotary drum itself has to be large enough so that the periphery of the drum can accommodate the required number of substrate wafers to be processed in a single batch. Because substrate wafers mounted on the rotary drum substantially face the axis of rotation of the drum, the ion beam must be directed at the substrates around the inner periphery of the drum at a relatively large angle to the rotation axis of the drum. Prior art concerning beam line architecture of an ion implanter typically requires the elements of the beam line, including ion source, analyzer magnet and beam acceleration unit, all to be located outside the periphery of the drum. In this way the beam can be directed in a straight line along a drift path across the diameter of the drum. Not only does this typical architecture result in drum type ion implanters occupying a relatively large footprint on the floor of a semiconductor fabrication facility, but the long drift path length of the ion beam across the diameter of the drum can cause difficulties in some applications.

BRIEF SUMMARY

An ion implant apparatus is provided comprising a rotary scan assembly having an axis of rotation and a periphery. A plurality of substrate holders are distributed about the periphery. These substrate holders are arranged to hold respective planar substrates at a common substrate tilt angle to define a total cone angle about the axis of rotation which is less than 60°.

The substrate tilt angle is defined as the angle of rotation of the plane of the substrate, about an axis through the center of the substrate which axis is tangential to the periphery of the rotary scan assembly, relative to a plane parallel to the axis of rotation of the axis scan assembly and containing the tangential axis.

The total cone angle of planar substrates mounted on a rotary scan assembly is a term of art which will be known to those skilled in this technology. If the common substrate tilt angle, as defined above, of the planar substrates mounted on the substrate holders of the rotary scan assembly is $\alpha$, then the total cone angle is $2\alpha$. It can be seen, therefore, that, in order for the total cone angle formed by planar substrates mounted on the holders on the rotary scan assembly to be less than 60°, the common tilt angle of the substrates should be less than 30°.

The ion implant apparatus further comprises a beam line assembly to provide a beam of ions for implantation in planar substrates on the substrate holders. The beam line assembly is arranged to direct the beam in a predetermined ion implant direction along a final beam path which is at an angle of at least 45° to the axis of rotation.

In operation of the apparatus, the planar substrates on the substrate holders successively intercept the final beam path in a travel direction as the rotary scan assembly rotates.

The beam line assembly further comprises in sequence in an ion beam direction, an ion source, an ion accelerator and a beam bending magnet. The ion accelerator is effective for accelerating ions from the ion source to produce an accelerated beam having a desired implant energy of at least 500 keV. The beam bending magnet has a beam inlet to receive the accelerated beam. The ion source, the accelerator and the beam inlet define a beam acceleration path which is linear from the ion source to the beam inlet of the beam bending magnet.

A method of implanting ions into planar substrates is also provided. The planar substrates are mounted on substrate holders distributed around the periphery of a rotary scan assembly. The substrate holders on the rotary scan assembly hold the respective planar substrates at a common substrate tilt angle to define a total cone angle about the axis of rotation of the scan assembly which is less than 60°.

The method of the invention comprises the following steps:

a) generating a source of ions including ions desired for implantation;

b) extracting and accelerating the ions from the source along a linear acceleration path to produce an accelerated ion beam having an energy of at least 500 keV;

c) bending the accelerated beam to direct an accelerated beam of ions desired for implantation in a predetermined implant direction along a final beam path which is at an angle to the axis of rotation of at least 45°; and d) rotating the rotary scan assembly such that the substrates successively intercept the beam path in a travel direction.

DETAILED DESCRIPTION OF THE INVENTION

In one embodiment of the ion implant apparatus, the beam line assembly includes an analyzer magnet which is located after the beam acceleration path and is operative to produce an angular separation in the accelerated beam between ions of different mass/charge ratios (m/e).

In an embodiment, the analyzer magnet is operative to direct ions having an m/e which is desired for implantation in the predetermined ion implant direction along the final beam path. In this embodiment, the ion implant apparatus further comprises an ion beam dump which is mounted on the rotary scan assembly and forms an annular beam dump region which rotates with the rotary scan assembly. The analyzer magnet is operative to direct ions having an m/e greater than the desired m/e towards the annular beam dump region.

In a further embodiment, the beam bending magnet is a beam scanner magnet operative to deflect the accelerated beam at a repetition rate through a range of deflection angles to produce a scanned beam such that the final beam path is scanned transversely relative to the travel direction of the substrate holders. In this embodiment, the beam line assembly may include an analyzer magnet which is located to receive the scanned beam from the beam scanner magnet over the range of deflection angles. The analyzer magnet is then operative to produce an angular separation between beam ions of different mass/charge ratios (m/e).

In an example, the analyzer magnet may be operative to direct ions having an m/e which is desired for implantation in a collimated scanned beam in the predetermined ion implant direction along the final beam path.

The embodiment may further comprise an ion beam dump mounted on the rotary scan assembly and forming an annular beam dump region which is rotated with the rotary scan assembly. The analyzer magnet is operative to direct ions of the accelerated beam having an m/e greater than the desired m/e towards the annular beam dump region.

In one embodiment, the final beam path has a total ion drift distance which is less than a diameter of the periphery of the rotary scan assembly. For example, the total drift distance may be less than half of the diameter of the periphery.

Also in embodiments, the acceleration path referred to above is aligned with the axis of rotation of the rotary scan assembly.

Specific applications of the ion implant apparatus and method include the production of laminae of crystalline semiconductor material, such as silicon. Such silicon laminae may be used for the production of photovoltaic cells. In such applications of the described apparatus and method, the ions to be implanted are typically $H^+$ ions.

Figure 1:
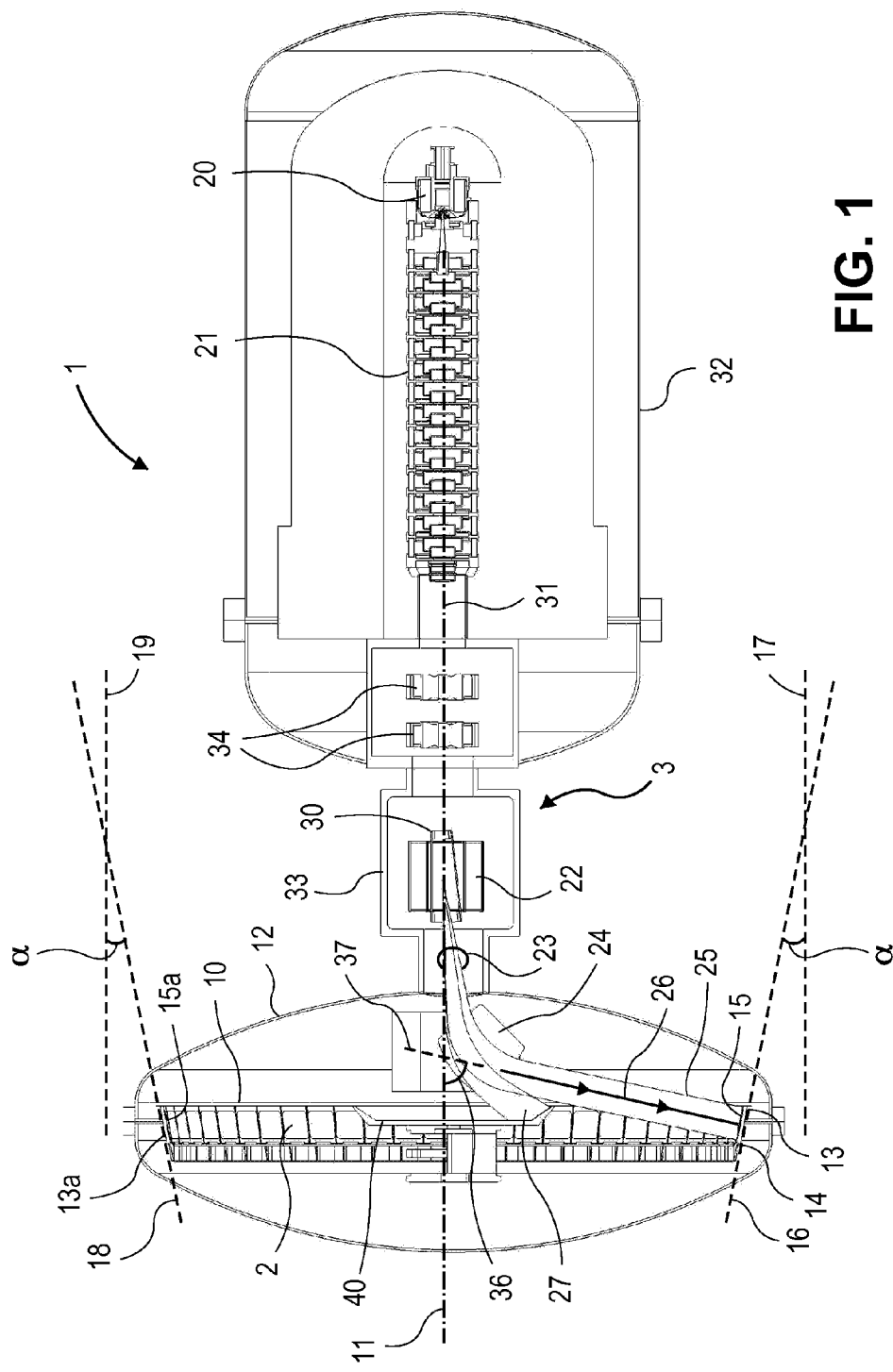
FIG. 1 is a schematic plan view of an example of an ion implant apparatus embodying the present invention.

An ion implant apparatus 1 is illustrated in FIG. 1. Ion implant apparatus 1 comprises a rotary scan assembly 10 mounted for rotation about an axis of rotation 11 within a vacuum enclosure 12 forming the process chamber of the implantation apparatus.

Rotary scan assembly 10 is illustrated schematically. Rotary scan assembly 10 is mounted on a rotary bearing to enable rotation at high speed about axis of rotation 11 by means of a drive motor. The rotary bearing and drive motor are not shown in the drawing for simplicity. Rotary scan assembly 10 comprises a scan wheel 2 having substrate holders 13 distributed around a periphery 14 of rotary scan assembly 10. Substrate holders 13 are arranged to hold respective planar substrates 15 also referred to as wafers. Typically, planar substrates 15 are wafers of silicon for implantation. In one example of ion implant apparatus 1, the wafers are about 156 mm square with rounded corners. Periphery 14 of rotary scan assembly 10 defines a diameter of about 3100 mm, so that about 60 wafers can be accommodated about the periphery without overlapping.

The substrate holders 13 hold the planar substrates or wafers 15 so exposed faces are directed inwards towards the axis of rotation 11. As illustrated in FIG. 1, the substrate holders 13 support wafers 15 at a tilt angle $\alpha$. The tilt angle $\alpha$ is defined as the angle by which the plane of wafer 15 is rotated about an axis tangential to the periphery 14 of rotary scan assembly 10, relative to a plane parallel to axis of rotation 11 containing the tangential axis. In FIG. 1, the tangential axis about which wafer 15 is rotated extends directly out of the paper at the location of indicated wafer 15. Tilt angle $\alpha$ for wafer 15 is illustrated by the angle between a first line 16 indicating the alignment of the plane of wafer 15 and a second line 17 drawn parallel to the axis of rotation 11.

Each substrate holder 13 distributed around periphery 14 of rotary scan assembly 10 are arranged to hold respective wafer 15 at the same tilt angle $\alpha$. For simplicity, only one substrate holder 13a is illustrated in FIG. 1 located diametrically opposite to the first mentioned substrate holder 13 and wafer 15 on rotary scan assembly 10. As before, substrate holder 13a holds wafer 15a at tilt angle $\alpha$ as the angle between a first line 18 in the plane of the wafer 15a and a second line 19 aligned parallel to the axis of rotation 11.

As can be seen in FIG. 1, if first lines 16 and 18 are continued to the left in the figure, the intersection point will be on the axis of rotation 11. Corresponding lines in the planes of other wafers 15 supported around periphery 14 of rotary scan assembly 10 also intersect at the same point on the axis of rotation 11. All of these lines lie on the surface of a cone having a cone axis on axis of rotation 11 and a total cone angle $2\alpha$.

The cone angle is a known term in the art in ion implantation, used to describe the angle at which wafers on a rotary scan assembly are tilted toward the axis of rotation. Rotary scan assemblies in ion implantation apparatuses for which the total cone angle is relatively small, may be referred to as drum-type scan assemblies, because for low cone angles, the wafers can be regarded as distributed around the interior surface of a drum. The present embodiment provides an ion implantation apparatus using a drum-type rotary scan assembly, for which the total cone angle of the substrate supports is less than 60°.

With such a structure, when rotary scan assembly 10, also referred to as drum wheel 10, is rotated at sufficiently high speed, wafers 15 can be supported on the substrate holders 13 around periphery 14 of the drum wheel 10 by means of centrifugal force alone. By using a cone angle of less than about 60°, so that tilt angle α of each wafer is less than about 30°, there can be sufficient friction between wafers 15 and underlying supporting surfaces of the substrate holders 13 to prevent wafers 15 sliding off the substrate holders 13 during processing. Furthermore, at low cone angles, the effect of centrifugal force ensuring good thermal contact between wafers 15 and underlying support surfaces of the substrate holders 13 is maximized. This is important if a high power ion beam is used during the implantation process, so that the heat from the beam power delivered to wafers 15 can be satisfactorily removed through the heat sinking properties of substrate holders 13. Typically the substrate holders 13 are water cooled.

The example apparatus 1 illustrated in FIG. 1 further includes a beam line assembly 3 comprising an ion source 20, an ion accelerator 21 and a beam bending magnet 22. Ion source 20 provides a source of ions including ions desired for implantation. In one example, ion source 20 may be a source of $H^+$ ions. Ion accelerator 21 is effective to extract and accelerate ions from the ion source to produce an accelerated ion beam having a desired implant energy. Ion accelerator 21 is effective to produce an accelerated ion beam having an energy of at least 500 keV. In one example, an ion beam comprising $H^+$ ions at energies in excess of 500 keV can be used for implantation into silicon wafers to produce a plane of weakness, allowing thin laminae of silicon to be exfoliated from the surface of the implanted wafer. Such laminae are useful for the manufacture of photovoltaic solar cells. In other examples, ion accelerator 21 may produce an accelerated beam having implant energies up to 1 MeV or greater.

In the example illustrated in FIG. 1, beam bending magnet 22 is a beam scanner magnet operative to deflect the accelerated beam at a repetition rate through a range of deflection angles. A scanned beam is produced and shown in FIG. 1 at 23. Beam scanner magnets to produce a scanned ion beam are well known to those skilled in this art.

In the example illustrated in FIG. 1, the beam line assembly 3 additionally comprises an analyzer magnet 24 located to receive an angular scanned beam 23 from beam bending magnet 22. Analyzer magnet 24 has an inlet aperture sufficient to accommodate angular scanned beam 23 over the full range of deflection angles, so that the entire angular scanned beam 23 passes through analyzer magnet 24. Analyzer magnet 24 is arranged and operative to produce an angular separation between beam ions of different mass/charge ratios (m/e). Analyzer magnets for mass analyzing ion beams are well known in the field of ion implantation. The curvature of the flight path of individual ions passing through a homogeneous magnet field in the analyzer magnet is, for ions having the same energy, a function of the m/e of the ions in the beam. As is well known to those skilled in the art, the flight paths of ions with a higher m/e have larger radii of curvature.

In the present example, analyzer magnet 24 is operative to direct ions having an m/e which is desired for implantation so that they exit the analyzer as a collimated scanned beam 25. Accordingly, analyzer magnet 24 is shaped so that ions at different deflection angles in the angular scanned beam 23 from beam bending magnet 22 receive exactly the amount of further angular deflection passing through analyzer magnet 24 so as to emerge from analyzer magnet 24 as collimated scanned beam 25 parallel to a predetermined ion implant direction along a final beam path indicated by the line 26 in FIG. 1.

In the particular example illustrated, for implanting $H^+$ ions, ion source 20 may produce a proportion of $H_2^+$ ions. It is undesirable for these $H_2^+$ ions to be implanted in wafers 15 along with the desired $H^+$ ions, as the energy of each proton of the $H_2^+$ ion will be half that of the energy of the protons from $H^+$ ions. As a result, the protons of $H_2^+$ ions may penetrate only half as deeply into the wafer on implantation. $H_2^+$ ions in angular scanned beam 23 from beam bending magnet 22 will have a radius of curvature in analyzer magnet 24 which is twice the radius of curvature of $H^+$ ions in the magnet, so that $H_2^+$ become angularly separated from the $H^+$ ions.

Analyzer magnet 24 is designed to have an exit aperture for the beam passing through the magnet which is sufficiently large in the separation plane of the magnet (the plane of the paper in FIG. 1) to allow not only collimated scanned beam 25 of $H^+$ ions to emerge as a collimated beam, as shown in FIG. 1, but also to allow the separate scanned beam of $H_2^+$ ions to emerge from analyzer magnet 24 as shown at beam 27. In this way, $H_2^+$ are separated out of angular scanned beam 23 and do not form part of collimated scan beam 25 which is directed by analyzer magnet 24 along final beam path 26. Unwanted ions separated by analyzer magnet 24 are directed to a beam dump which will be described in further detail below.

In summary, the beam line assembly 3, comprising ion source 20, ion accelerator 21, beam bending magnet 22 and analyzer magnet 24, is arranged to direct collimated scanned beam 25 of desired ions in the predetermined ion implant direction along final beam path 26. Final beam path 26 is at an angle to the axis of rotation 11 of the rotary scan assembly 10 of at least 45°. In practice, the angle with the axis of rotation 11 may be higher, typically over about 70° and in one example, about 78°.

Final beam path 26 may be slightly skew relative to axis of rotation 11, so that a straight line forming a rearward extension of final beam path 26 does not intersect axis of rotation 11. In this case, the angle between final beam path 26 and the of rotation 11 is defined for the purposes of this patent as the angle between axis of rotation 11 and the projection of the final beam path 26 onto a plane containing the axis of rotation 11 and the point of intersection of final beam path 26 with periphery 14 of rotary scan assembly 10. It is demonstrated, therefore, that the angle between final beam path 26 and axis of rotation 11, is the angle 36 as it appears in the plane of the paper of FIG. 1, between axis of rotation 11 and a dashed line 37 forming a rearward extension of final beam path 26.

Beam bending magnet 22 has an inlet 30 to receive th accelerated ion beam 31 from ion accelerator 21. As illustrated in FIG. 1, a beam acceleration path from ion source 20, through ion accelerator 21 to inlet 30 of the beam bending magnet 22 is linear. In practice, this means that practically all ions extracted from ion source 20 pass through ion accelerator 21 and are therefore accelerated to the desired implant energy. This distinguishes the beam line of the described embodiment from typical prior art beam lines, where the ion beam extracted from the ion source is mass analyzed, to select only ions required for implantation, before passing the required ions to a beam accelerator to bring the required ions up to the desired implant energy.

In one embodiment, ion accelerator 21 is an electrostatic accelerator, so that ion source 20 is at a high electric potential corresponding to the required implant beam energy. For example, if the implant beam energy required is 500 keV, the ion source 20 is at +500 kV relative to vacuum enclosure 12 of the implant chamber which is normally at ground potential. By providing a straight line path comprising ion source 20, ion accelerator 21 up to inlet 30 of beam bending magnet 22, there is no need to locate analyzer magnet 24 at a high potential close to the potential of ion source 20. This is an important advantage, as, in order to limit the physical size of the ion accelerator 21, while achieving appropriate electrostatic insulation performance, ion source 20 and ion accelerator 21 may be enclosed in a chamber 32 containing an insulating gas such as $SF_6$.

Ion accelerator 21 comprises an accelerator column providing a vacuum tight interior space for the passage of the ion beam. Beam bending magnet 22 is located in a vacuum chamber portion 33 which communicates with the interior of vacuum enclosure 12 containing rotary scan assembly 10. The vacuum chamber portion 33 in turn communicates through an aperture in an end wall of $SF_6$ chamber 32 with the interior of the column of the ion accelerator 21, so that the ion source itself as well as the accelerator column is effectively evacuated through the connection with the vacuum chamber portion 33.

In the example illustrated in FIG. 1, a magnetic quadrupole assembly 34 is interposed in $SF_6$ chamber 32 at the high energy end of ion accelerator 21. Magnetic quadrupole assembly 34 is operative to modify the shape of the accelerated beam as required to provide a desired beam footprint on substrate wafers 15 passing through final beam path 26.

Further details of an ion source and ion accelerator assembly in a housing of insulating gas such as $SF_6$ can be derived from co-pending application Ser. No. 12/962,723, filed Dec. 8, 2010 and assigned to the same assignee of this application. The disclosure of this co-pending application is incorporated herein by reference in its entirety for all purposes.

As mentioned above, analyzer magnet 24 is effective to separate ions in the scanned beam from beam bending magnet 22 which have the desired m/e, from ions having a higher value m/e. Desired ions are, in the example, $H^+$ ions, and these are directed by analyzer magnet 24 in collimated scanned beam 25 along final beam path 26 to be implanted in substrate wafers 15 on substrate holders 13 around periphery 14 of rotary scan assembly 10.

Figure 2:
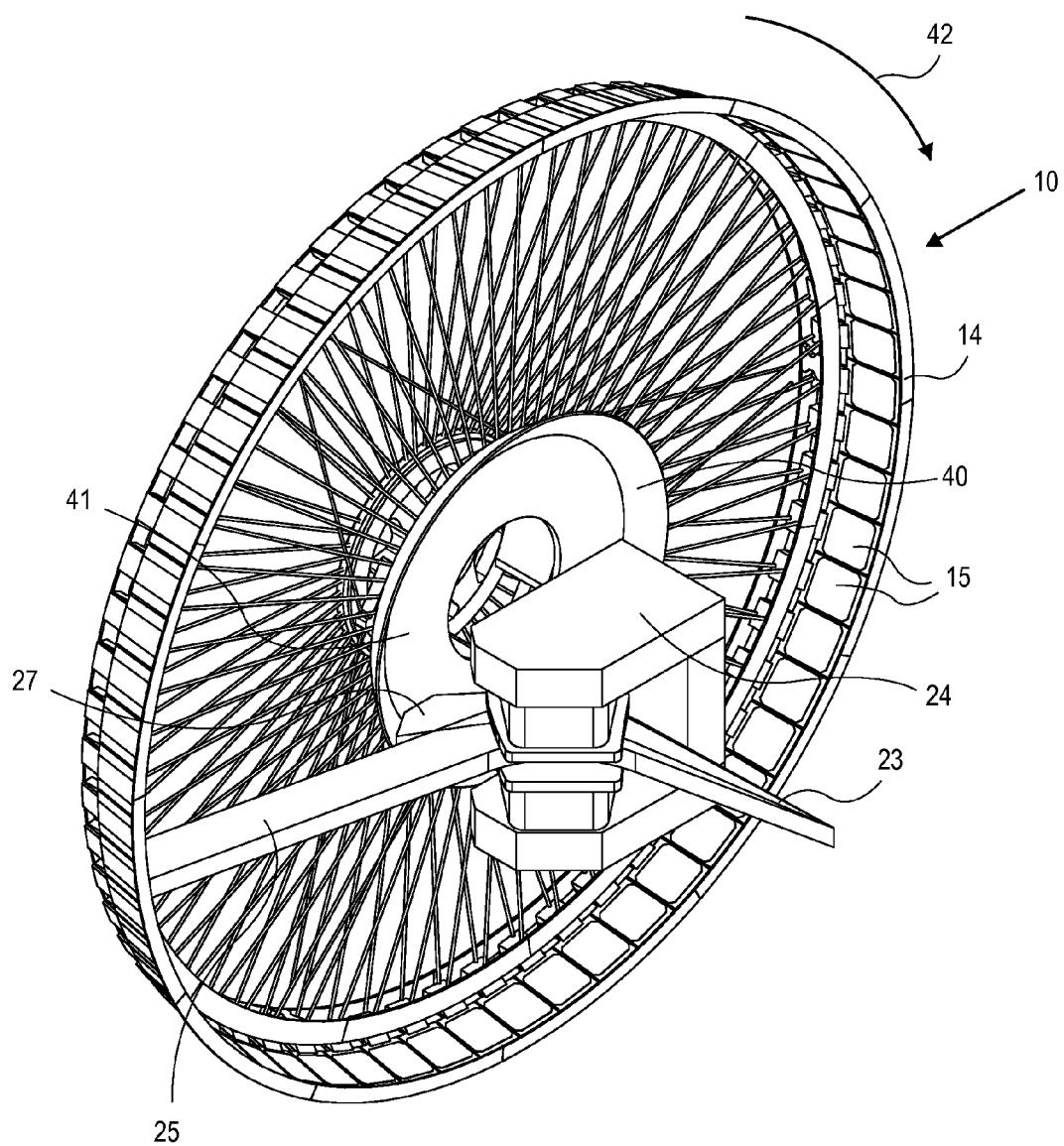
FIGS. 2 and 3 are schematic views of the rotary scan assembly of the implant apparatus of FIG. 1, illustrating an ion beam dump mounted on the rotary scan assembly in accordance with an embodiment of the invention.
Figure 3:
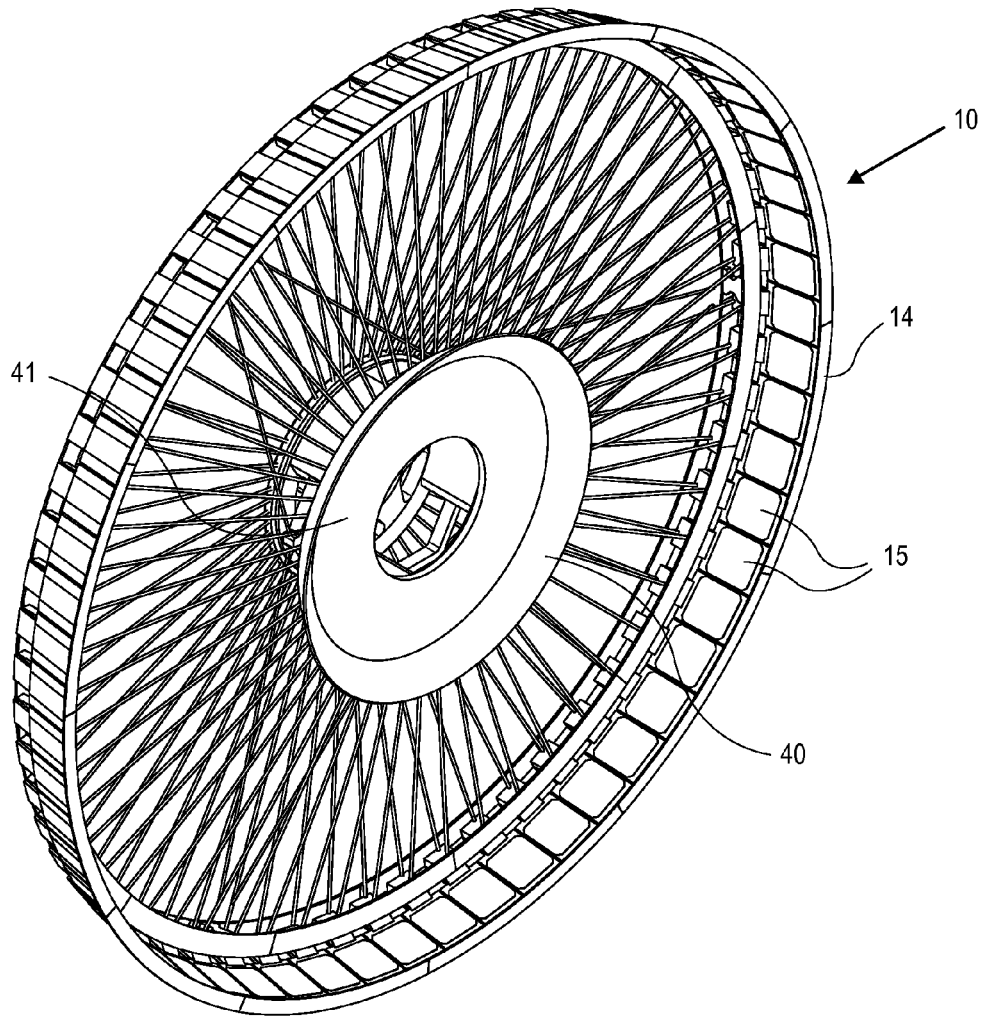

In this example, the ion species which are not desired are primarily $H_2^+$ ions, which emerge from analyzer magnet 24 along beam 27 to impinge on a beam dump 40. FIGS. 2 and 3 show ion beam dump 40 on rotary scan assembly 10 in more detail. Ion beam dump 40 is mounted on rotary scan assembly 10 and forms an annular beam dump region 41 which rotates with rotary scan assembly 10.

As best shown in FIG. 2, angular scanned beam 23 from beam bending magnet 22 (which is not shown in FIG. 2) enters analyzer magnet 24. The magnetic field in analyzer magnet 24 produces collimated scanned beam 25 which is directed along final beam path 26 to intersect periphery 14 of rotary scan assembly 10. In operation, rotary scan assembly 10 is rotated, e.g. in the direction of arrow 42, at high speed so that substrate wafers 15 mounted on substrate holders 13 around periphery 14 successively intercept collimated scanned beam 25. The beam is scanned by the beam bending magnet 22 sufficiently so that collimated scanned beam 25 extends uniformly over the width of wafers 15, which is approximately 153 mm in one example.

In the example, collimated scanned beam 25 comprises substantially only $H^+$ ions. $H_2^+$ ions emerge from analyzer magnet 24 along beam 27 which is directed at the annular beam dump region 41 of beam dump 40. Because all ions from ion source 20 have been accelerated to the desired implant energy (above 500 KeV and typically 1 MeV), beam 27 of $H_2^+$ ions may deliver a substantial amount of beam power to beam dump 40. For example, the ion implant apparatus 1 may be designed to deliver a beam of $H^+$ ions to the wafers being implanted having an energy of about 1 MeV and a beam current of at least 100 mA. Thus, the power delivered by implant beam 25 may exceed 100 kW. Even if only 10% of the beam extracted from ion source 20 comprises $H_2^+$ ions, beam 27 of $H_{2+}$ ions impinging on beam dump 40 may deliver power in excess of 10 kW to beam dump 40.

By arranging beam dump 40 to have an annular beam dump region 41 which rotates with the rotary scan assembly 10, this beam power is distributed over the whole annular surface of beam dump 40. In one embodiment, beam dump 40 is water cooled so that the power delivered by beam 27 can be removed.

Referring again to FIG. 1, the architecture of ion implant apparatus 1 illustrated has a number of features which provide significant advantages. Analyzer magnet 24 is located inside the axial profile of rotary scan assembly 10 or drum wheel 10. As a result, final beam path 26 of collimated scanned beam 25 between the outlet of analyzer magnet 24 and periphery 14 of drum wheel 10 can be relatively short. Over this final beam path 26, the ion beam is generally in a region of zero electric or magnetic field. The length of the beam path in a region of no electrical magnetic field is referred to as the ion drift distance. It is generally desirable to keep the drift distance of ion beams as short as possible to minimize the problem of controlling the ion beam over the drift distance. In the present example, the drift distance of final beam path 26 is less than the diameter of drum wheel 10. More particularly in the illustrated example, analyzer magnet 24 is located near axis of rotation 11 of drum wheel 10, so that the drift distance of final beam path 26 is less than the radius of drum wheel 10.

Also, in the illustrated example, the beam acceleration path from ion source 20 to inlet 30 of beam bending magnet 22 is aligned substantially parallel to axis of rotation 11 of drum wheel 10. In this example, accelerated ion beam 31 path is also located close to axis of rotation 11. As a result, the entire beam line assembly, comprising ion source 20, ion accelerator 21, magnetic quadrupole assembly 34, beam bending magnet 22, and analyzer magnet 24 is physically contained within the axial profile of drum wheel 10 of ion implant apparatus 1. This enables the spatial footprint of ion implant apparatus 1 to be kept to a minimum, saving space on the production floor of the fabrication facility.

The above embodiment has been described with particular reference to the implantation of $H^+$ ions in silicon wafers for the purpose of exfoliating thin laminae of silicon for use in the manufacture of photovoltaic cells. However, the features as set out in the attached claims have more general application in the field of ion implantation.

In one embodiment, tilt angle $\alpha$ at which substrate wafers 15 are supported around periphery 14 of drum wheel 10 is about 10°, and final beam path 26 has an angle relative to axis of rotation 11 of drum wheel 10 of about 78°. However, other tilt angles may be contemplated while still obtaining the benefits of the present invention.

Ion implant apparatus is also disclosed having the following combinations of features:

A) Ion implant apparatus comprising a rotary scan assembly having an axis of rotation and a periphery defining a diameter, a plurality of substrate holders distributed about periphery so as to travel around periphery when rotary scan assembly is rotated about axis, substrate holders arranged to hold respective planar substrates at a common wafer tilt angle to define a total cone angle about axis of rotation which is less than 60°, a beam line assembly to provide a beam of ions for implantation in planar substrates on substrate holders, beam line assembly being arranged to direct beam in a predetermined ion implant direction along a final beam path having a total drift distance, final beam path being at an angle to axis of rotation of at least 45°, drift distance being less than diameter, planar substrates on substrate holders successively intercepting final beam path in a travel direction as rotary scan assembly rotates, wherein beam line includes a beam scanner to deflect the beam at a repetition rate such that the final beam path is scanned at repetition rate transversely relative to travel direction of substrate holders.

B) Ion implant apparatus comprising a rotary scan assembly having an axis of rotation and a periphery, a plurality of substrate holders distributed about periphery so as to travel around periphery when scan assembly is rotated about axis, substrate holders arranged to hold respective planar substrates at a common wafer tilt angle to define a total cone angle about axis of rotation which is less than 60°, a beam line assembly to provide a beam of ions for implantation in planar substrates on substrate holders, beam line assembly being arranged to direct beam in a predetermined ion implant direction along a final beam path, planar substrates on substrate holders successively intercepting final beam path as rotary scan assembly rotates, wherein beam line assembly includes an analyzer magnet operative to produce an angular separation between beam ions of different mass/charge ratios (m/e), and to direct ions having a desired m/e in predetermined ion implant direction along final beam path, an ion beam dump is mounted on rotary scan assembly, forming an annular beam dump region which rotates with rotary scan assembly, and analyzer magnet is operative to direct ions having an m/e greater than desired m/e towards annular beam dump region.

A plurality of embodiments have been provided for clarity and completeness. Other embodiments of the invention will be apparent to one of ordinary skill in the art when informed by the present specification. Whereas detailed arrangements and ranges of parameters for implant apparatus and for an implant method have been described herein, other arrangements and parameter settings can be used which fall within the scope of the appended claims.

The foregoing detailed description has described only a few of the many forms that this invention can take. For this reason the detailed description is intended by way of illustration and not by way of limitation. It is only the following claims, including all equivalents, which are intended to define the scope of the invention.

The invention claimed is:

1. An ion implant apparatus comprising:
a rotary scan assembly having an axis of rotation and a periphery;
the rotary scan assembly further having an axial profile about said axis of rotation and extending to said periphery;
a plurality of substrate holders distributed about said periphery, said substrate holders arranged to hold respective planar substrates at a common substrate tilt angle to define a total cone angle about said axis of rotation which is less than 60°;
and a beam line assembly to provide a beam of ions for implantation in said planar substrates on said substrate holders, said beam line assembly comprising in sequence in an ion beam direction: an ion source, an ion accelerator effective to accelerate ions from said ion source to produce an accelerated beam having a desired implant energy, and a beam bending magnet having a beam inlet to receive said accelerated beam; wherein said ion source, said accelerator and said beam inlet defining a beam acceleration path which is linear from said ion source to said beam inlet of said beam bending magnet;
wherein said beam line assembly further includes an analyzer magnet which is located inside said axial profile of said rotary scan assembly;
wherein said beam line assembly is arranged to direct said beam in a predetermined ion implant direction along a final beam path, which is at an angle of at least 45° to said axis of rotation; and wherein said planar substrates on said substrate holders successively intercept said final beam path in a travel direction as said rotary scan assembly rotates.

2. Ion implant apparatus as claimed in claim 1, wherein said analyzer magnet is located after said beam acceleration path and is operative to produce an angular separation in said accelerated beam between ions of different mass/charge ratios (m/e).

3. Ion implant apparatus as claimed in claim 1,
wherein said analyzer magnet is operative to direct ions having an m/e which is desired for implantation in said predetermined ion implant direction along said final beam path,
wherein said implant apparatus further comprises an ion beam dump which is mounted on said rotary scan assembly and forms an annular beam dump region which rotates with said rotary scan assembly, and
wherein said analyzer magnet is operative to direct ions having an m/e greater than said desired m/e towards said annular beam dump region.

4. Ion implant apparatus as claimed in claim 1, wherein said final beam path has a total ion drift distance which is less than a diameter of said periphery of said rotary scan assembly.

5. Ion implant apparatus as claimed in claim 1, wherein said planar substrates comprise a crystalline semiconductor material.

6. Ion implant apparatus as claimed in claim 5, wherein said crystalline semiconductor material is silicon.

7. Ion implant apparatus as claimed in claim 1, wherein said beam of ions for implantation comprises $H^+$ ions.

8. An ion implant apparatus comprising:
a rotary scan assembly having an axis of rotation and a periphery;
a plurality of substrate holders distributed about said periphery, said substrate holders arranged to hold respective planar substrates at a common substrate tilt angle to define a total cone angle about said axis of rotation which is less than 60°;
and a beam line assembly to provide a beam of ions for implantation in said planar substrates on said substrate holders, said beam line assembly comprising in sequence in an ion beam direction: an ion source, an ion accelerator effective to accelerate ions from said ion source to produce an accelerated beam having a desired implant energy, and a beam bending magnet having a beam inlet to receive said accelerated beam; wherein said ion source, said accelerator and said beam inlet defining a beam acceleration path which is linear from said ion source to said beam inlet of said beam bending magnet;
wherein said beam line assembly further includes an analyzer magnet which is located near said axis of rotation of said rotary scan assembly;
wherein said beam line assembly is arranged to direct said beam in a predetermined ion implant direction along a final beam path, which is at an angle of at least 45° to said axis of rotation; and wherein said planar substrates on said substrate holders successively intercept said final beam path in a travel direction as said rotary scan assembly rotates.

9. An ion implant apparatus comprising:
a rotary scan assembly having an axis of rotation and a periphery;
the rotary scan assembly further having an axial profile about said axis of rotation and extending to said periphery;
a plurality of substrate holders distributed about said periphery, said substrate holders arranged to hold respective planar substrates at a common substrate tilt angle to define a total cone angle about said axis of rotation which is less than 60°;
and a beam line assembly to provide a beam of ions for implantation in said planar substrates on said substrate holders, said beam line assembly comprising in sequence in an ion beam direction: an ion source, an ion accelerator effective to accelerate ions from said ion source to produce an accelerated beam having a desired implant energy, and a beam bending magnet having a beam inlet to receive said accelerated beam; wherein said ion source, said accelerator and said beam inlet defining a beam acceleration path which is linear from said ion source to said beam inlet of said beam bending magnet;
wherein said beam line assembly is physically contained within said axial profile of said rotary scan assembly;
wherein said beam line assembly is arranged to direct said beam in a predetermined ion implant direction along a final beam path, which is at an angle of at least 45° to said axis of rotation; and
wherein said planar substrates on said substrate holders successively intercept said final beam path in a travel direction as said rotary scan assembly rotates.

10. Ion implant apparatus as claimed in claim 9, wherein said beam line assembly includes an analyzer magnet which is located after said beam acceleration path and is operative to produce an angular separation in said accelerated beam between ions of different mass/charge ratios (m/e).

11. Ion implant apparatus as claimed in claim 9,
wherein said beam line assembly includes an analyzer magnet,
wherein said analyzer magnet is operative to direct ions having an m/e which is desired for implantation in said predetermined ion implant direction along said final beam path,
wherein said implant apparatus further comprises an ion beam dump which is mounted on said rotary scan assembly and forms an annular beam dump region which rotates with said rotary scan assembly, and
wherein said analyzer magnet is operative to direct ions having an m/e greater than said desired m/e towards said annular beam dump region.

12. Ion implant apparatus as claimed in claim 9, wherein said beam bending magnet is a beam scanner magnet operative to deflect said accelerated beam at a repetition rate through a range of deflection angles, to produce a scanned beam such that said final beam path is scanned transversely relative to said travel direction of said substrate holders.

13. Ion implant apparatus as claimed in 12, wherein said beam line assembly includes an analyzer magnet which is located to receive said scanned beam from said beam scanner magnet over said range of deflection angles and is operative to produce an angular separation between beam ions of different mass/charge ratios (m/e).

14. Ion implant apparatus as claimed in 13, wherein said analyzer magnet is operative to direct ions having an m/e which is desired for implantation in a collimated scanned beam in said predetermined ion implant direction along said final beam path.

15. Ion implant apparatus as claimed in claim 14, further comprising an ion beam dump mounted on said rotary scan assembly and forming an annular beam dump region which rotates with said rotary scan assembly, wherein said analyzer magnet is operative to direct ions of said accelerated beam having an m/e greater than said desired m/e towards said annular beam dump region.

16. Ion implant apparatus as claimed in claim 9, wherein said final beam path has a total ion drift distance which is less than a diameter of said periphery of said rotary scan assembly.

17. Ion implant apparatus as claimed in claim 9, wherein said acceleration path is aligned with said axis of rotation of said rotary scan assembly.

18. Ion implant apparatus as claimed in claim 9, wherein said planar substrates comprise a crystalline semiconductor material.

19. Ion implant apparatus as claimed in claim 18, wherein said crystalline semiconductor material is silicon.

20. Ion implant apparatus as claimed in claim 9, wherein said beam of ions for implantation comprises $H^+$ ions.

* * * * *